(12) United States Patent
Li et al.

(10) Patent No.: US 9,979,918 B2
(45) Date of Patent: May 22, 2018

(54) IMAGE SENSOR AND DATA TRANMISSION METHOD THEREOF

(71) Applicant: SHANGHAI IC R&D CENTER CO., LTD., Shanghai (CN)

(72) Inventors: Chen Li, Shanghai (CN); Jianxin Wen, Shanghai (CN); Yuhang Zhao, Shanghai (CN)

(73) Assignee: SHANGHAI IC R&D CENTER CO., LTD, Shanghai (CN)

( * ) Notice: Subject to any disclaimer, the term of this patent is extended or adjusted under 35 U.S.C. 154(b) by 202 days.

(21) Appl. No.: 15/104,236

(22) PCT Filed: Sep. 30, 2014

(86) PCT No.: PCT/CN2014/087889
§ 371 (c)(1),
(2) Date: Jun. 13, 2016

(87) PCT Pub. No.: WO2015/113407
PCT Pub. Date: Aug. 6, 2015

(65) Prior Publication Data
US 2016/0316165 A1    Oct. 27, 2016

(30) Foreign Application Priority Data
Jan. 30, 2014    (CN) .......................... 2014 1 0045272

(51) Int. Cl.
*H04N 5/378* (2011.01)
*H04N 5/3745* (2011.01)
*H04N 5/355* (2011.01)
*H04N 5/347* (2011.01)
*H01L 27/146* (2006.01)

(52) U.S. Cl.
CPC ............. *H04N 5/378* (2013.01); *H04N 5/347* (2013.01); *H04N 5/3559* (2013.01); *H04N 5/37457* (2013.01); *H01L 27/14641* (2013.01)

(58) Field of Classification Search
CPC ...... H04N 5/378; H04N 5/347; H04N 5/3559; H04N 5/37457; H01L 27/14641
See application file for complete search history.

(56) References Cited

U.S. PATENT DOCUMENTS

2016/0028985 A1* 1/2016 Vogelsang ........ H01L 27/14641
348/294

* cited by examiner

*Primary Examiner* — Nelson D. Hernández Hernández
(74) *Attorney, Agent, or Firm* — Tianchen LLC.

(57) ABSTRACT

The present invention provides an image sensor comprising a pixel array module composed of pixel groups, multiple switch control modules, a PFA, a pipelined ADC and a decode module. Each pixel group comprises multiple unit pixels which form at least one unit pixel. Each switch control module corresponds to a row of the pixel array module and includes a first transmission circuit and a second transmission circuit. The PGA process the data outputted by the first and second transmission circuits and the pipelined ADC performs A/D conversion to the data outputted by the PGA. The decode module controls the first and second transmission circuits of each row to alternately read and transmit the unit pixel data, and controls all the first and second transmission circuits to successively output the data of the unit pixels readout thereby to the PGA.

20 Claims, 5 Drawing Sheets

--Prior Art--

IMAGE SENSOR AND DATA TRANMISSION METHOD THEREOF

CROSS-REFERENCE TO RELATED APPLICATION

This application claims the priority benefit of International Patent Application Serial No. PCT/CN2014/087,889, filed Sep. 30, 2014, which is related to and claims the priority benefit of China patent application serial No. 201410045272.3 filed Jan. 30, 2014. The entirety of each of the above-mentioned patent applications is hereby incorporated by reference herein and made a part of this specification.

FIELD OF THE INVENTION

The present invention relates to the field of image sensor and more particular to an image sensor and the data transmission method thereof.

BACKGROUND OF THE INVENTION

An image sensor, which can be either a CCD (charge coupled device) or a CMOS (complementary metal oxide silicon) image sensor, is an important component of a digital camera. Recently, the CMOS image sensor has been widely used due to its high pixel sensitivity, short exposure time and decreased pixel size. As one of the most important performance indicators of the CMOS image sensor, the pixel sensitivity is determined by the product of the pixel fill factor (the ratio of the photosensitive area and the total pixel area) and the quantum efficiency (the number of the electrons converted from the incident light).

The conventional CMOS image sensor utilizes Front Side Illumination (FSI) technology. In a FSI image sensor, photodiodes, metal layers and micro-lens are manufactured in order from the front side of the substrate and light pipe channels are created through the metal layers allowing for light travelling from the micro-lens to the photodiodes. The FSI technology has the advantages of simple process, high compatibility with the CMOS process and low cost. Furthermore, since the filling material in the light pipe channel can be changed to achieve different refractive index, the transmissivity of the incident light can be promoted and the crosstalk between the adjacent pixels can be reduced. However, with the reduction of the pixel size, it is increasingly difficult to improve the fill factor of the FSI image sensor. One solution is to use back side illumination (BSI) technology. During the fabrication of a BSI image sensor, the photodiodes and the metal layers are firstly formed in the front side of the substrate, then the substrate is thinned from its backside (usually to the thickness of less than 20 um), then Through-Silicon-Via (TSV) technology is performed to lead out the signal from the photodiodes. Since the interconnection circuits are formed at the backside of the substrate and the entire front surface is reserved for the photodiodes, the BSI image sensor is advantageous to provide higher fill factor. Due to the cost consideration and the substrate thinning process restriction, the BSI technology is always applied to the image sensors with small pixel size, such as the camera of the smart phones Generally, the bigger pixel area of a pixel unit will lead to higher sensitivity and larger dynamic range. In the current Single Lens Reflex camera (SLR camera), micro Single Lens Reflex camera, High-definition monitor and other CMOS image sensor application fields, FSI image sensors with bigger pixel areas are usually utilized. On the other hand, pixels with smaller size are also desired to decrease the size of the image sensor. As a result, the requirements for higher sensitivity and lower size make contradictory.

Accordingly, it is necessary to provide a new image sensor to solve the problem. In the prior art, an image sensor capable of performing pixel binning and pixel splitting is proposed. As shown in FIG. 1, the image sensor adopts column analog-to-digital conversion (ADC) system architecture by arranging a plurality of column ADC modules 4 on one side or opposite sides of the pixel array module 1, wherein each column ADC module 4 corresponds to one or two columns of the pixel array. A decode module 2 is configured to select one row of the pixel array, control the PGA (programmable gain amplifier) module 3 to successively amplify the split pixel data or the binned pixel data of each row, and control the column ADC modules to convert the data into digital data and output the digital data in sequence by the shift registers thereof. However, since the layout of the column ADC modules is much bigger, the image sensor capable of performing pixel binning and pixel splitting based on the column ADC modules usually requires large pixel size. For those image sensors having smaller pixel size (the pixel size is no more than 2.5 µm), since the space reserved for the layout of the column ADC modules is only 2.5 µm or 5 µm, the column ADC system architecture is unsatisfied.

BRIEF SUMMARY OF THE DISCLOSURE

The main object of the present invention is to overcome the defect of the conventional technology, and provides an image sensor based on the pipelined analog-to-digital converter and being capable of performing pixel binning and pixel splitting as required, so as to switch the resolution of the image sensor of small pixel size and perform data transmission accordingly.

To achieve the above object, the present invention provides an image sensor comprising a pixel array module including a plurality of pixel groups arranged in P rows and Q columns, each of the pixel groups comprises multiple pixels, the multiple pixels form at least one unit pixel, wherein P, Q are positive integers; multiple switch control modules each corresponds to one row of the pixel array module to read out the data of the unit pixels, each switch control module comprises a first transmission circuit and a second transmission circuit; a programmable gain amplifier module connected to the first transmission circuits and the second transmission circuits of all the rows of the pixel array module configured to process the data read out from the first transmission circuits and the second transmission circuits; a pipelined analog-to-digital converter module connected to the programmable gain amplifier module configured to convert the data outputted by the programmable gain amplifier module into digital data; a decode module configured to control the first transmission circuit and the second transmission circuit corresponding to each row to alternately read and transmit the data of the unit pixels of the row, and control all the first transmission circuits and the second transmission circuits to successively output the data read out thereby to the programmable gain amplifier module.

Preferably, each pixel group comprises a reading circuit, the first transmission circuit and the second transmission circuit corresponding to each row are connected to the output terminals of the reading circuits of the row; the decode module controls the reading circuits corresponding to the same row to successively output the data of the unit pixels in the row, and controls the first transmission circuit and the second transmission circuit to alternately read and transmit the data read out by the reading circuits of the corresponding row to the programmable gain amplifier module.

Preferably, each of the reading circuits comprises multiple transfer transistors, a floating diffusion node, a reset transistor, a source follower transistor and a row select transistor, wherein the multiple transfer transistors are respectively connected to the pixel photodiodes of the pixel group; the drain electrodes of the multiple transfer transistors, the gate electrode of the source follower and the source electrode of the reset transistor are connected at the floating diffusion node; the drain electrode of the row select transistor is connected to the source electrode of the source follower, the source electrode of the row select transistor is connected to the input terminals of the first transmission circuit and the second transmission circuit.

Preferably, the decode module controls each of the reading circuits to output a first data when the reset transistor thereof empties and resets the charges accumulated at the floating diffusion node and thereafter output a second data when the transfer transistors corresponding to one of the unit pixels are turned on, wherein the first data and the second data represent the data of the unit pixel.

Preferably, each of the transmission circuits comprises a first capacitance configured to read the first data and a second capacitance configured to read the second data; the output terminals of the first capacitances are connected to the programmable gain amplifier module through a first data bus, the output terminals of the second capacitances are connected to the programmable gain amplifier module through a second data bus; for any of the transmission circuits, the decode module controls the first capacitance and the second capacitance to successively read the first data and the second data and simultaneously transmit the two reading results to the programmable gain amplifier module through the first data bus and the second data bus.

Preferably, the programmable gain amplifier module subtracts the two reading results to obtain the data of the unit pixel and then amplifies and outputs to the analog-to-digital converter module.

Preferably, each of the first capacitances or the second capacitance is configured to have one end connected to the ground and the other end connected to a read switch and an output switch in series with the read switch, the read switch is connected to the input terminal of the first transmission circuit or the second transmission circuit and the output terminal is connected to the first data bus or the second data bus.

Preferably, the decode module controls all the first/second transmission circuits to read a group of the unit pixel data outputted by the reading circuits of the pixel groups in one column simultaneously and then serially transmit the read data of the unit pixels to the programmable gain amplifier module; when the data of the unit pixels read by the first/second transmission circuits is transmitted completely, the decode module controls all the second/first transmission circuits to read a next group of the unit pixel data outputted by the same reading circuits or the reading circuits of the pixel groups in the next column.

Preferably, the decode module controls the first capacitances of the P first/second transmission circuits to read the first data outputted by the reading circuits of the pixel groups in one column simultaneously and then controls the second capacitances of the P first/second transmission circuits to read the second data outputted by the same reading circuits simultaneously after the reading of the first data is completed so as to obtain P two-reading results; the decode module controls the P two-reading results to be successively transmitted to the programmable gain amplifier module.

The present invention also provides a data transmission method of the image sensor mentioned above. The method comprises:

Step S1, setting the unit pixel;

Step S2, performing pixel data reading out, processing and analog-to-digital conversion to the unit pixels of the pixel array module;

wherein for each row of the pixel array module, the data of the unit pixels in the row is read and outputted alternately and successively by the corresponding first transmission circuit and second transmission circuit; wherein for the pixel array module, the data of the unit pixels readout by the first transmission circuits and the second transmission circuits is successively outputted to the programmable gain amplifier module.

Preferably, for all the rows of the pixel array module, the data of the P unit pixels readout by the first/second transmission circuits each time is successively and serially transmitted to the programmable gain amplifier module to be processed and outputted to the pipelined analog-to-digital converter module, and when the data of the P unit pixels previously read by the first/second transmission circuits is transmitted completely, the second/first transmission circuits start a next reading of the data of the P unit pixel.

Preferably, each of the pixel groups comprises a reading circuit, the first transmission circuit and the second transmission circuit are connected to the output terminals of the reading circuits of the pixel groups in the corresponding row; each of the reading circuits comprises multiple transfer transistors respectively connected to the pixel photodiodes of the pixel group, a floating diffusion node, a reset transistor, a source follower transistor and a row select transistor, wherein the Step S2 further comprises:

S20: turning on one transmission circuit while turning off the other transmission circuit of each switch control module;

S21: performing charge empty and reset to the floating diffusion node of the reading circuit of the $i^{th}$ pixel group in each row of the pixel array module, and reading out a first data by the reading circuit;

S22: reading the P first data through all the turned on transmission circuits;

S23: turning on the transfer transistors corresponding to the $j^{th}$ unit pixel of the $i^{th}$ pixel group in each row of the pixel array module and reading out a second data by the reading circuit, wherein i, j are both positive integers, i is less than or equal to Q, j is less than or equal to the quantity of the unit pixels;

S24: reading the P second data through all the turned on transmission circuits, wherein each of the first data and the second data form a two-path data;

S25: transmitting the P two-path data to the programmable gain amplifier module successively and processing the received P two-path data by the programmable gain amplifier module; wherein each two-path data is transmitted to the programmable gain amplifier module simultaneously through the first bus and the second bus;

S26: performing analog-to-digital conversion to the processed data outputted by the programmable gain amplifier module and outputting the corresponding digital data successively;

S27: turning off the turned on transmission circuit and turning on the turned off transmission circuit;

S28: repeating the steps S21 to S27 until the digital data of all the unit pixel in the pixel array module is serially outputted.

Preferably, each of the transmission circuits comprises a first capacitance and a second capacitance, each of the first capacitances or the second capacitances is configured to have one end connected to the ground and the other end connected to a read switch and an output switch in series, the read switch is connected to the input terminal of the first transmission circuit or the second transmission circuit and the output switch is connected to the first data bus or the second data bus, wherein the first data bus and the second data bus are both connected to the programmable gain amplifier module; wherein the Step S22 comprises: turning on the read switches connected to the first capacitances, turning off the output switches connected to the first capacitances and turning off the read switches and the output switches connected to the second capacitances to store the first data into the first capacitances; wherein the Step S24 comprises: turning on the read switches connected to the second capacitances, turning off the output switches connected to the second capacitances and turning off the read switches and the output switches connected to the first capacitances to store the second data into the second capacitances; wherein in the Step 25, for each transmission circuit, the output switches respectively connected to the first capacitance and the second capacitance are turned on simultaneously and the read switches respectively connected to the first capacitance and the second capacitance are turned off simultaneously so as to output each of the two-path data at a same time through the first data bus and the second data bus.

According to the present invention, the resolution of the image sensor can be regulated according to the actual conditions or requirements, the image quality can be optimized under different conditions through pixel splitting or pixel binning, which makes the image sensor much more intelligent and widely used. Furthermore, compared with the conventional image sensor, the image sensor of the present invention utilizes pipelined ADC module, which avoids the manufacturing difficulties brought by the layout height restriction of the column ADC circuits for the image sensors having small pixel size. The present invention saves the layout greatly through the data transmission circuit design and is suitable for small pixel sized CMOS image sensors. Furthermore, since the data transmission circuit utilizes two transmission circuits to read the unit pixel data alternatively, the requirement for the sampling frequency of the pipelined ADC module can be reduced.

DETAILED DESCRIPTION OF THE EMBODIMENTS

To understand the present invention more clearly and easily, the present invention will now be descried more fully hereinafter with reference to the accompanying drawings. The present invention shall not be limited to the embodiments set forth herein. General substitution known by the technical personnel in the art is within the protection scope of the present invention.

Figure 1:
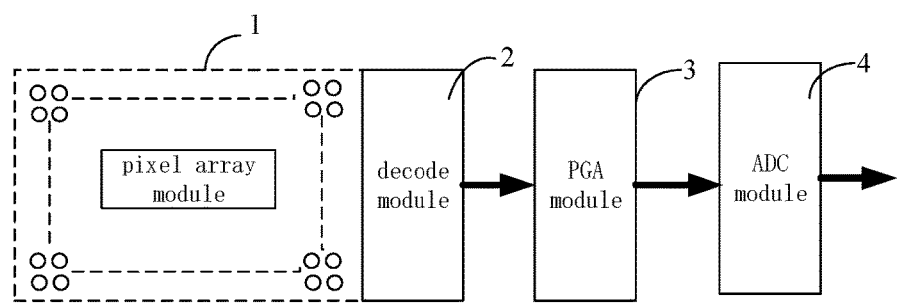
FIG. 1 is a block diagram of the conventional image sensor.
Figure 2:
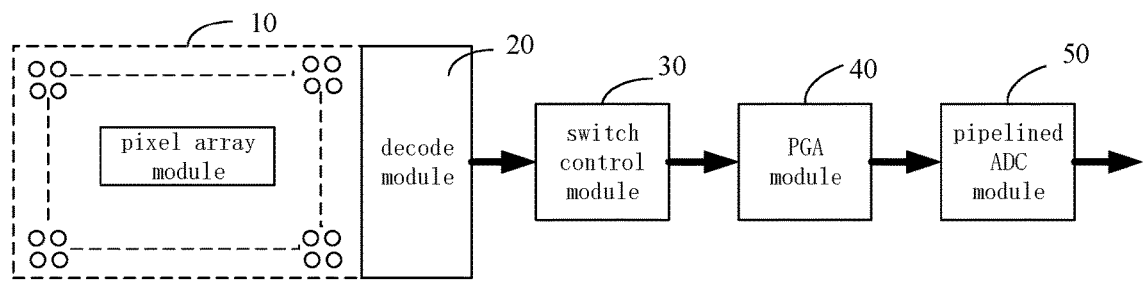
FIG. 2 is a block diagram of the image sensor according to an embodiment of the present invention.

FIG. 2 is a block diagram of the image sensor of the present invention. As shown in FIG. 2, the image sensor comprises a pixel array module 10, a decode module 20, a switch control module 30, a PGA (programmable gain amplifier) module 40 and a pipelined ADC (analog-to-digital converter) module 50. The pixel array module 10 can be a pixel array formed by a plurality of pixel groups arranged in a matrix of multiple rows and multiple columns. Each pixel groups comprises multiple pixels, these pixels in one pixel group form at least one unit pixel. The multiple switch control modules 30 each corresponds to one row of the pixel array module 10 to read out the data of the unit pixels. Each switch control module 30 comprises a first transmission circuit and a second transmission circuit. The PGA module 40 is connected to the first transmission circuits and the second transmission circuits of all the rows of the pixel array module 10, and is configured to process the data outputted from the first transmission circuits and the second transmission circuits. The pipelined ADC module 50 is connected to the PGA module 40 to convert the data outputted by the PGA module 40 into digital data. The decode module 20 is configured to control the first transmission circuit and the second transmission circuit corresponding to each row to alternately read and transmit the data of the unit pixels of the row. Furthermore, since all the switch control modules 30 share one PGA module 40 and one pipelined ADC module, the decode module 20 also controls all the first transmission circuits and the second transmission circuits of the switch control modules 30 to successively output the read data to the PGA module 40.

The components of the image sensor of the present invention and the operating principle of the image sensor will be described in detail as follows.

Figure 3:
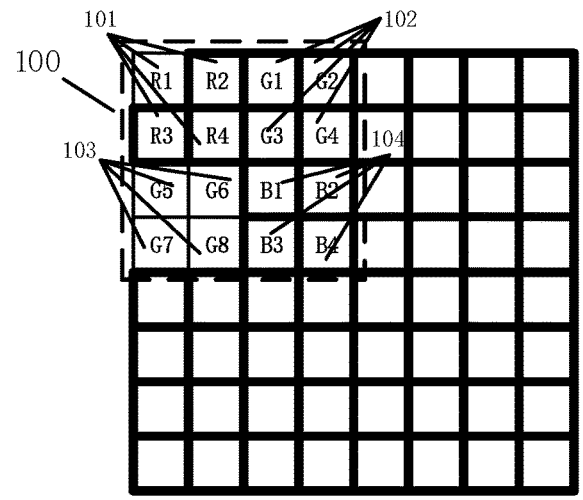
FIG. 3 is a pixel array diagram of the image sensor in an embodiment of the present invention.
Figure 4:
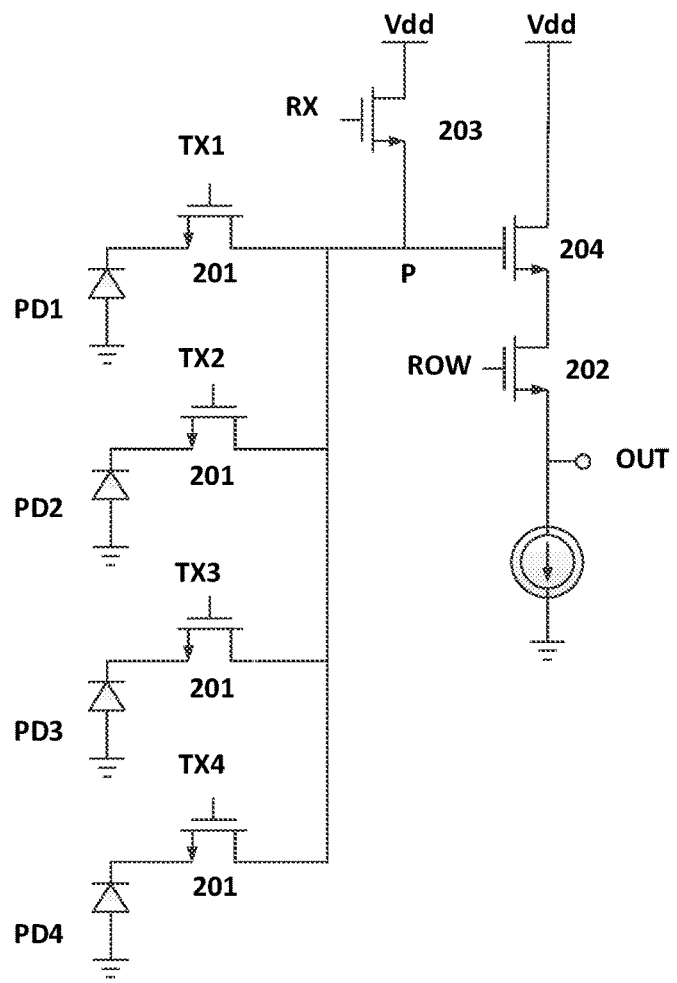
FIG. 4 is a diagram showing the reading circuit of a pixel group of the image sensor in an embodiment of the present invention.

FIG. 3 is a pixel array diagram of the image sensor in an embodiment of the present invention and FIG. 4 is a diagram showing the reading circuit of a pixel group of the image sensor in an embodiment of the present invention.

As shown in FIG. 3, the image sensor comprises multiple pixel cells 100, each pixel cell 100 comprises multiple pixel groups 101, 102, 103, 104, and each pixel group comprises multiple pixels.

In the embodiment, the pixel groups in each pixel cell 100 are arranged in a Bayer pattern. Each pixel cell comprises a red pixel group 101, two green pixel groups 102, 103, and a blue pixel group 104. Optionally, the pixel cell can also be provided with other pattern. Furthermore, the pixel groups can also be arranged in a non-RGB pattern, such as a CMMY pattern, which is not detailed herein.

In the embodiment, the red pixel group 101 comprises 4 red pixels R1, R2, R3 and R4, each green pixel group 102/103 comprises 4 green pixels G1, G2, G3 and G4, or G5, G6, G7 and G8, the blue pixel group 104 comprises 4 blue pixels B1, B2, B3 and B4. Therefore, one pixel cell 100 comprises 4 red pixels, 8 green pixels, 4 blue pixels, which is a total of 16 pixels. For each pixel group, it is capable of performing pixel splitting and pixel binning.

The pixel splitting and pixel binning mentioned above refers to the combination of the pixels in each pixel group to realize various photosensitive area under different light conditions. Specifically, under the strong light condition, each of the red pixel groups (R1/R2/R3/R4), green pixel groups (G1/G2/G3/G4), green pixel groups (G5/G6/G7/G8) and blue pixel groups (B1/B2/B3/B4) functions as 4 unit pixels respectively. If the photosensitive area of each pixel is S, then under the strong light condition, one pixel cell 100 of the image sensor comprises 16 unit pixels, the photosensitive area is 16S, thus the image sensor works in a pixel splitting mode to achieve higher resolution. Under the low light condition, the red pixel group (R1/R2/R3/R4) functions as one red unit pixel R, the green pixel group (G1/G2/G3/G4) functions as one green unit pixel Ga, the green pixel group (G5/G6/G7/G8) functions as one green unit pixel Gb, and the blue pixel group (B1/B2/B3/B4) functions as one blue pixel B. If the photosensitive area of each pixel is S, then under the low light condition, one pixel cell 100 comprises 4 unit pixels. The photosensitive area of each unit pixel is 4S, which is four times of the unit pixel photosensitive area under the strong light condition. Thus the image sensor is switched to the pixel binning mode in which the signal strength is four times greater than that in the pixel splitting mode so as to achieve improved dynamic range and higher sensitivity. Accordingly, compared with the convention image sensors, the image sensor of the present invention which can perform pixel splitting and pixel binning has greater dynamic range and sensitivity and better image quality under the low light condition. In the embodiment, the unit pixel is formed by the combination of the pixels in the pixel group. For example, in the pixel splitting mode, the unit pixel comprises only one pixel and thus one pixel group comprises four unit pixels, while in the pixel binning mode, the unit pixel comprises four pixels, that is, one pixel group comprises only one unit pixel. Obviously, one unit pixel can include different amounts of pixels as long as the total quantity of the pixels in the pixel group is integral multiples of the quantity of the pixels forming the unit pixel. For example, two pixels can be combined to form a unit pixel and thus the image sensor can be used under the moderate light condition.

According to the present invention, the image sensor capable of performing pixel splitting and pixel binning will switch to the pixel splitting mode to acquire higher pixel quantity when the image sensor is applied under strong ambient light conditions, such as being applied in a moving car in the day time; when the image sensor is used under the low light conditions such as in a car moving in the tunnel or the underground garage, or moving in a cloudy day or at night, the image sensor will switch to the binning mode to realize high quality to low light by reducing the pixel quantity.

To realize the pixel splitting and binning function, each of the pixel groups comprises a reading circuit as shown in FIG. 4.

Specifically, as shown in FIG. 4, the reading circuit comprises transfer transistors 201, a row select transistor 202, a reset transistor 203, a source follower transistor 204, and a floating diffusion node P. Wherein, the four transfer transistors 201 are respectively connected to the pixel photodiodes (PD1/PD2/PD3/PD4) of the pixel group to respectively read and output the data of the pixel photodiodes to the floating diffusion node P. The source electrode of the source follower transistor 204 transmits the data accumulated at the floating diffusion node P to the row select transistor 202. The reset transistor 203 is configured to empty and rest the charges at the floating diffusion node P. The row select transistor 202 is configured to select the corresponding pixel group of the reading circuit and output the corresponding unit pixel data to be processed.

Since each pixel group comprises four pixels, for example, the red pixel group comprises four red pixels, there exist four pixel photodiodes (PD1/PD2/PD3/PD4) correspondingly. In order to read out the signal from the pixel photodiodes individually, each pixel photodiode is connected to a transfer transistor 201, and each transfer transistor 201 receives a gating signal TXi (TX1/TX2/TX3/TX4) at its gate. When the gating signal TXi is at high potential, the corresponding transfer transistor 201 turns on and outputs the data of the connected pixel photodiode to the floating diffusion node P. The row select transistor 202 receives a selection signal ROW at its gate to select a pixel group, when the select signal ROW is at high potential, the pixel group corresponding to the switch control circuit having the row select transistor 202 is selected. The reset transistor 203 receives a reset signal RX at its gate to empty and rest the charges at the floating diffusion node P. When the reset signal RX is at high potential, the reset transistor 203 turns on and a supply voltage Vdd is coupled to the floating diffusion node P, thus to empty and reset the charges at the node P. Wherein, the gate signal TXi, the select signal ROW, and the reset signal RX are all controlled by the decode module.

The connection relations between the components of the reading circuit is provided as follows:

The source electrode of each transfer transistor 201 is connected to the output terminal of the pixel photodiode 201, the gate electrode thereof is connected to the select signal TXi, and the drain electrode thereof is connected to the source electrode of the reset transistor 203 at the floating diffusion node P.

The gate electrode of the row select transistor is connected to the select signal ROW, the drain electrode of the row select transistor is connected to the source electrode of the source follower transistor, and the source electrode is connected to the output terminal OUT of the reading circuit.

The gate electrode of the reset transistor 203 is connected to the reset signal RX, the source electrode is connected to the gate electrode of the source follower 204 at the floating diffusion node P, and the drain electrode is connected to the supply voltage Vdd.

The gate electrode of the source follower transistor 204 is connected to the source electrode of the reset transistor 203, the source electrode is connected to the drain electrode of the row select transistor 202, the drain electrode is connected to the supply voltage Vdd.

In a pixel group, the four transfer transistors 201 share the same floating diffusion node P, different unit pixel data can be read out by controlling the voltage potential of the gate signal TXi. For example, the data of the four pixels can be read out simultaneously as a combined unit pixel data or successively as four unit pixel data by the reading circuit of the pixel group. When the data of each pixel in the pixel group is transmitted successively, the image sensor is switched to the pixel splitting mode which obtains greater pixel quantity and resolution and can be applied under strong light condition. When the data of each pixel in the pixel group are combined and read out, the image sensor is switched to the pixel binning mode in which the signal strength is quadrupled and the dynamic range and sensitivity increases, although the resolution decreases as the pixel quantity is quartered. Furthermore, since the pixel group comprises four pixel photodiodes PD1, PD2, PD3, PD4 and seven transistors, each pixel photodiode shares 1.75 transistors, which increase the fill factor of the pixel group under the same pixel area, and thus to achieve better signal to noise ratio (SNR) and sensitivity.

Figure 5A:
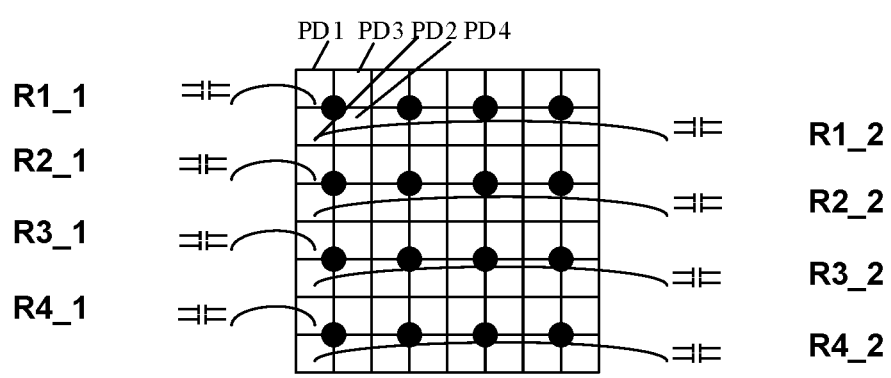
FIG. 5a is a diagram showing the image sensor working in a pixel splitting mode in an embodiment of the present invention.
Figure 5B:
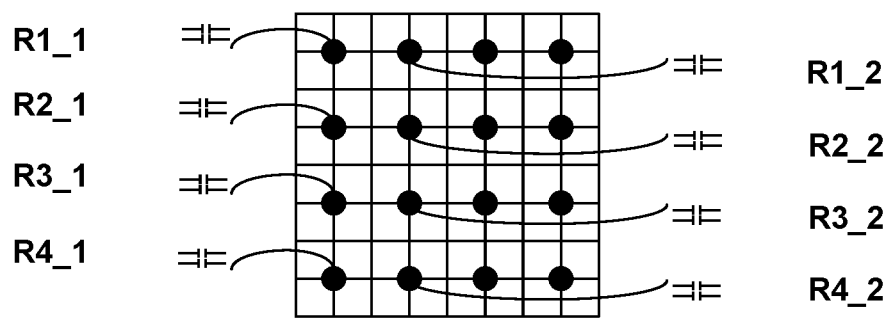
FIG. 5b is a diagram showing the image sensor working in a pixel binning mode in an embodiment of the present invention.

In the layout configuration of a pixel group, such as the red pixel group (R1, R2, R3, R4) region, each red pixel has a pixel photodiode, all the transistors of the switch control circuit are arranged in the center of the four red pixels, which refers to the black spot region in FIG. 5a and FIG. 5b. The layout of the green pixel groups (G1, G2, G3, G4, G5, G6, G7, G8) and the blue pixel groups (B1, B2, B3, B4) are the same with that of the red pixel group, and a detailed description is omitted herein.

Figure 6:
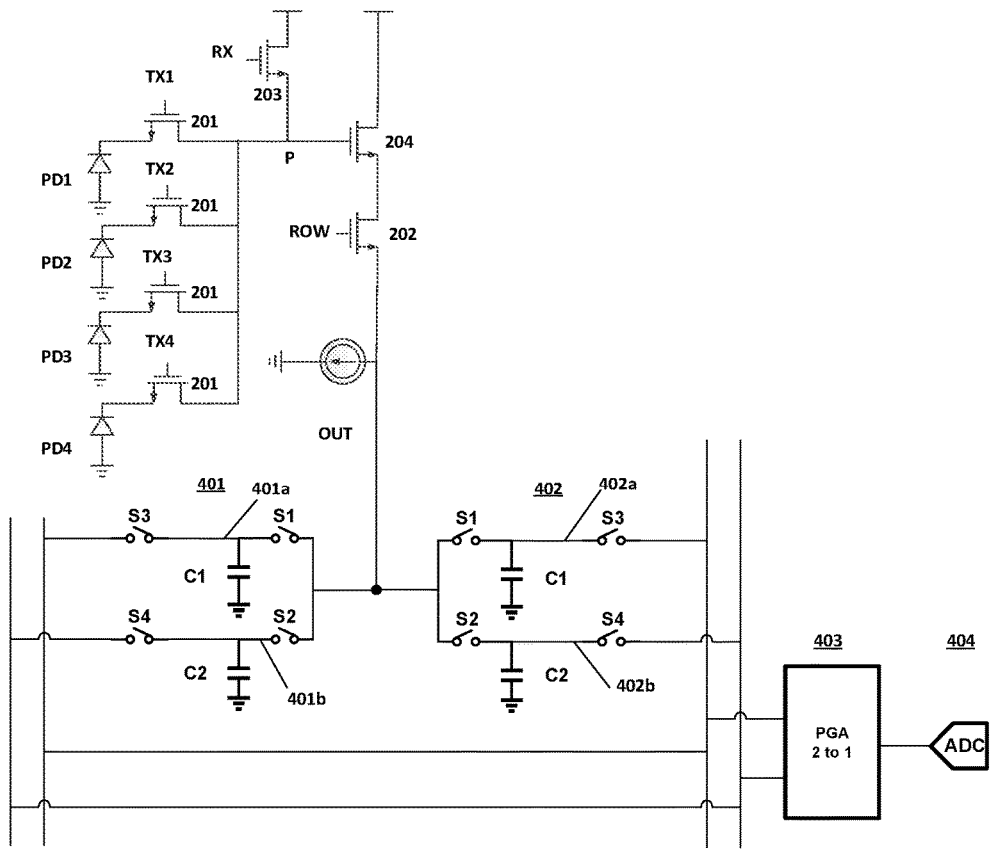
FIG. 6 is a diagram showing the connection relation of the pixel group and the transmission circuits of the switch control module in an embodiment of the present invention.

To realize the data transmission of the image sensor, multiple switch control modules each corresponding to one row of the pixel array module are provided for the pixel array module composed of pixel groups, these pixel groups form a pixel array arranged in a matrix of P rows and Q columns (P, Q are integers). Each switch control module comprises a first transmission circuit and a second transmission circuit. In the embodiment, the pixel array comprises 16 pixel groups arranged in a matrix of 4 rows and 4 columns, one switch control module is provided for four pixel groups in one row of the pixel array. The output terminals of the reading circuits of the four pixel groups are all connected to the input terminals of the first transmission circuit and the second transmission circuit of the corresponding switch control module. FIG. 6 illustrates the connection relations of the reading circuit of a pixel group and the two transmission circuits. As shown in FIG. 6, the output terminals of the reading circuit of each pixel group is connected to the input terminals of the transmission circuits 401, 402. It should be noted that the output terminals of the reading circuits of the other three pixel groups are also connected to the input terminals of the two transmission circuits 401, 402, which is not illustrated in FIG. 6. The two transmission circuits alternatively read and transmit all the unit pixel data of the corresponding row under the sequential control of the decode module. When the image sensor works in the pixel splitting mode, the unit pixel refers to a single pixel in the pixel group, the decode module controls the four reading circuits in a row to read out data in turn and controls each of the reading circuits to read out the data of the four pixels in the corresponding pixel group successively, and controls the two transmission circuits alternatively and successively read the 16 pixel unit data read out by the four reading circuits as the four pixel group in one row comprises 4×4=16 pixels. When the image sensor works in the pixel binning mode, the unit pixel refers to a pixel group, the decode module controls the four reading circuits of the same row to read out the data of the four pixel groups (the combined data of the four pixels in a pixel group) successively, and controls the two transmission circuits alternatively and successively read the data of the four pixel groups.

Since the pixel array includes four columns, the number of the transmission circuit 401 or 402 is correspondent to the column number of the pixel array, and is four in the embodiment. In the embodiment, the four transmission circuits 401 form a group, and the four transmission circuits 402 form another group. The decode module controls four transmission circuits 401 (or four transmission circuits 402) to successively and serially transmit the unit pixel data read thereby, and controls one group of the transmission circuits, such as the transmission circuits 402 to start a new reading of the unit pixel data after the other group of the transmission circuits 401 has already completed the unit pixel data transmission. To be specific, when the image sensor works in the pixel splitting mode, the control module controls the four reading circuits to read out the data of the pixel photodiodes PD1 in the pixel groups in the first column, then the four transmission circuits 401 read the data of the four pixel photodiodes PD1 simultaneously and serially transmit to the programmable gain amplifier 403. When the data transmission is finished, the decode module controls the four reading circuits to read out the data of the pixel photodiodes PD2 in the pixel groups in the first column, then the four transmission circuits 402 read the data of the four pixel photodiodes PD2 simultaneously and serially transmit to the programmable gain amplifier 403 to be processed. It is noted that before the four transmission circuits 402 start reading the data of the four pixel photodiodes PD2, the data of the four pixel photodiodes PD1 has to be completely outputted. The PGA module 403 process the data serially outputted by the transmission circuits 401 or 402, and transmits it to the pipelined ADC module 404 which performs A/D conversion and finally outputs the corresponding digital data. After the pixel data of the four photodiodes of the pixel groups in the first column are successively transmitted, the pixel data of the four photodiodes of the pixel groups in the second column begins to be transmitted, and so on, until all the 64 pixel data of the pixel array module is completely transmitted, so as to realize the data transmission under the pixel splitting mode.

When the image sensor works in the pixel binning mode, the decode module controls the four reading circuits to read out the combined data of the four pixels of the pixel groups in the first column, then the four transmission circuits 401 start reading the four combined data simultaneously and serially transmit to the PGA module 403, after the four combined data has been completely transmitted, the decode module controls the four reading circuits of the pixel groups in the second column to read out the combined data of the four pixels of the pixel groups in the second column, then the four transmission circuits 402 start reading the four combined data simultaneously and serially transmit to the PGA module 403 to be processed. It is noted that before the four transmission circuits 402 start reading the combined data of the pixel groups in the second column, the combined data of the pixel groups in the first column has to be completely outputted. The PGA module 403 process the combined data serially outputted by the transmission circuits 401 or 402, and transmits to the pipelined ADC module 404 which performs A/D conversion and finally outputs the corresponding digital data. After the combined data of the pixel groups in the second column are transmitted, the combined data of the pixel groups in the third column begins to be transmitted, and so on, until all the 16 combined data of the pixel array module is completely transmitted, so as to realize the data transmission under the pixel binning mode.

Referring to FIG. 6, in order to read the data of the unit pixel, each transmission circuit 401 (402) comprises a first capacitance C1 and a second capacitance C2. The capacitance C1 is connected to the PGA module 403 through a first data bus, the capacitance C2 is connected to the PGA module 403 through a second data bus. Each of the capacitances C1 and C2 is provided with a corresponding driving buffer (not shown) to drive the data bus. One end of the capacitance C1 is connected to a read switch S1 and an output switch S3, the other end of the capacitance C1 is connected to the ground. The read switch S1 and the output switch S3 are series connected. The read switch S1 has one terminal connected to the output terminal OUT of the reading circuit and the other terminal connected to the grounded capacitance C1, and the output switch S3 has one terminal connected to the grounded capacitance C1. One end of the capacitance C2 is connected to a read switch S2 and an output switch S4, the other end of the capacitance C2 is connected to the ground. The read switch S2 and the output switch S4 are series connected. The read switch S2 has one terminal connected to the output terminal OUT of the reading circuit and the other terminal connected to the grounded capacitance C2, the output switch S4 has one terminal connected to the grounded capacitance C2 and the other terminal connected to the second data bus B2. The decode module controls the on and off of the read switches and the output switches so as to control the capacitance C1 and C2 to read and output the unit pixel data. To be specific, for each of the reading circuits, the capacitance C1 is configured to read the first data read out by the reading circuit when the reset transistor empties and resets the charges accumulated at the floating diffusion node, the capacitance C2 is configured to read the second data read out by the reading circuit when the transfer transistors connected to the corresponding unit pixels are tuned on after the empty and reset is done. Herein, the first data and the second data represent the data of the unit pixel. Therefore, the capacitances C1 and C2 read the first data and second data in turn, and then simultaneously transmit the first and the second data to the PGA module 403 through the first data bus and the second data bus respectively. The PGA module 403 performs a 2 to 1 operation to the first data and the second data, that is, the PGA module subtracts the two-path data of the first data and the second data and amplifies the subtraction result. The pipelined ADC module 404 is connected to the output of the PGA module 403 for analog-to-digital conversion.

Next, the sequential control process of the image sensor data transmission by the decode module will be described in further details as following.

Figure 7:
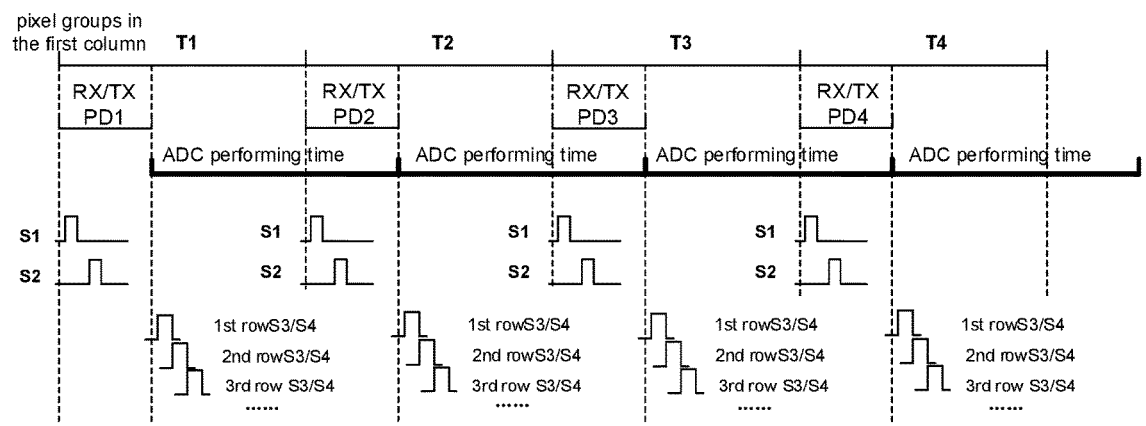
FIG. 7 is a sequence diagram showing the data transmission of the image sensor in the pixel splitting mode in an embodiment of the present invention.

FIG. 7 is a sequence diagram showing the data transmission of the image sensor in the pixel splitting mode in an embodiment of the present invention. In the embodiment, the unit pixel is consisted of a single pixel in the pixel group. The data transmission will be described with reference to FIG. 5a, FIG. 6 and FIG. 7.

The pixel array shown in FIG. 5a comprises 4×4 pixel groups, and each pixel group comprises four pixels, each pixel has a pixel photodiode (PD1/PD2/PD3/PD4). Four switch control modules (R1, R2, R3, R4) are provided corresponding to the number of the rows of the pixel array and each switch control module comprises two transmission circuits (such as R1_1 and R1_2). When the exposure of the image sensor is completed, the unit pixel data are transmitted column-by-column from the first column of the pixel array until all the unit pixel data are transmitted completely. FIG. 7 is a sequence diagram illustrating the data transmission of the pixel groups in one column during the time periods from T1 to T4 when the image sensor works in the pixel splitting mode. Firstly, the decode module sets the select signal ROW to high potential to turn on the row select transistor 202 and select the four pixel groups in the first column of the pixel array. In the time period of T1, the first transmission circuits (R1_1, R2_1, R3_1, R4_1) respectively read out the data of the four pixel photodiodes PD1 of the four pixel groups in the first column, while the second transmission circuits are closed. To be specific, firstly the RX signals of the transistors 203 in the reading circuits of the four pixel groups in the first column are set at high potential, thus the corresponding transistors 203 are turned on, the floating diffusion node P is coupled to the supply voltage Vdd and the charges at the floating diffusion node P are emptied and reset. At this time, the voltage at the floating diffusion node is approximately equal to Vdd, such as 3.3V. The output voltage of the reading circuit equals to the voltage at the floating diffusion node P subtracting the gate-to-source voltage of the source follower transistor and the drain-to-source voltage of the row select transistor, which is referred as the first data. The decode module opens the four read switches S1 of the four first transmission circuits (R1_1, R2_1, R3_1, R4_1) to perform the first reading of the first data outputted by the four reading circuits and meanwhile keeps the output switches S3, the read switches S2 and the output switches S4 of the four first transmission circuits off. The four reading results are respectively stored in the capacitances C1. Then the decode module turns off the four read switches S1 of the four first transmission circuits 401. After that, the decode module sets the RX signals to low potential so as to close the rest transistors 203 and sets the gate signal TX1 to high potential to open the transfer transistor 201 connected to the pixel photodiode PD1 and keeps other transfer transistors turned off. Thus, the charge generated from the pixel photodiode PD1 is transmitted to the floating diffusion node P, and the output voltage of the switch control circuit is the voltage at the floating diffusion node P subtracting the gate-to-source voltage of the source follower transistor and the drain-to-source voltage of the row select transistor, which is referred as the second data. The decode module opens the four read switches S2 of the four first transmission circuits while keeps the four output switches S4, the four read switches S1 and the four output switches S3 closed so as to perform a second reading of the second data. The reading results are stored in the four capacitances C2 respectively. Then, the decode module sets the gate signal TX1 to low potential. Accordingly, the capacitance C1 of each first transmission circuit (R1_1/R2_1/R3_1/R4_1) stores the first data as the first reading result, and the capacitance C2 of each first transmission circuit stores the second data as the second reading result. The first data and the second data represent the data of the pixel photodiodes PD1.

Furthermore, the decode module controls the four first transmission circuits to transmit the unit pixel data successively. To be specific, the decode module opens the output switches S3 and S4 of the first transmission circuit R1_1 simultaneously while keeps the output switches of the other first transmission circuits R2_1, R3_1, R4_1 closed. Therefore, the two-reading results of the first data and the second data of the pixel photodiodes PD1 of the pixel group in the first column and first row are transmitted to the PGA module 403 through the first data bus and the second data bus simultaneously. The PGA module 403 subtracts each of the two reading results to obtain the difference of the supply voltage Vdd and the voltage of the pixel photodiode PD1, amplifiers the difference and outputs the processed data to the pipelined ADC module 404. The pipelined ADC module 404 performs the analog-to-digital conversion. It is understood that the difference of each two reading results can represent the data of a pixel photodiode PD1 since the stronger incident light causes more charges generated from the pixel photodiode PD1 and smaller difference of the two reading results. After the two-reading results are completely transmitted to the PGA module by the first transmission circuit R1_1, the decode module opens the output switches S3 and S4 of the second transmission circuit R2_1 while keeps the output switches of the other transmission circuits closed, thus the two-reading results of the photodiode PD1 of the pixel group in the first column and second row of the pixel array are transmitted to the PGA module through the first data bus and the second data bus to be processed and outputted to the pipelined ADC module. By analogy, the pixel data of the photodiodes PD1 of the four pixel groups in the first column are successively transmitted to the pipelined ADC module and the digital data converted by the pipelined ADC module are finally outputted in sequence.

Then, during the time period of T2, the decode module controls the four second transmission circuits (R1_2, R2_2, R3_2, R4_2) to output the data of the pixel photodiodes PD2 of the four pixel groups in the first column while keeps the first transmission circuits closed.

Specifically, the four second transmission circuits (R1_2, R2_2, R3_2, R4_2) all store the respective two-reading results of the first data and the second data read in succession through the capacitance C1 and C2 and successively transmits the four two-reading results to the programmable gain amplifier through the first data bus B1 and the second data bus B2 to be processed by the programmable gain amplifier and outputted to the pipelined ADC. During the first reading, the decode module sets the signal RX coupled to the gate of the reset transistor 203 in the reading circuit of each pixel group in the first column to high potential. As a result, the output voltage of the reading circuit equals to the supply voltage subtracting the gate-to-source voltage of the source follower transistor and the drain-to-source voltage of the row select transistor, which is referred as the first data. Then the decode module opens the read switches S1 of all the second transmission circuits (R1_2, R2_2, R3_2, R4_2) to perform the first reading of the first data while keeps the output switches S3, S4 and the read switches S2 closed so as to store the four first data into the capacitances C1 of the four first transmission circuits. Then the decode module closes the read switches S1 of the second transmission circuits. After that, the decode module sets the signals RX to low potential. During the second reading, the decode module sets the gate signal TX2 to high potential to turns on the transfer transistors connected to the pixel photodiodes PD2 while turns off the other transfer transistors. The charges generated from the pixel photodiodes PD2 are transmitted to the floating diffusion nodes P. Accordingly, the output voltage of the each reading circuit equals to the voltage at the floating diffusion node P subtracting the gate-to-source voltage of the source follower transistor and the drain-to-source voltage of the row select transistor, which is referred as the second data. Then the decode module opens the read switches S2 of all the second transmission circuits to perform the second reading of the second data while keeps the output switches S3, S4 and the read switches S2 closed so as to store the four second data into the capacitances C2 of the four second transmission circuits. Afterwards, the decode module sets the gate signals TX2 to low potential. As a result, each second transmission circuit (R1_2/R2_2/R3_2/R4_2) stores the first data in the capacitance C1 after the first reading and stores the second data in the capacitance C2 after the second reading, each first and second data represents the data of the pixel photodiode PD2.

After that, the decode module opens the output switches S3 and S4 of the transmission circuit R1_2 and closes the output switches S3 and S4 of the other three transmission circuits so as to transmit the two reading results of the pixel photodiode PD2 of the pixel group in the first column and the first row of the pixel array to the PGA module 403 simultaneously through the first and second data buses. The PGA module processes the two-reading results and then transmits to the pipelined ADC module 404 for A/D conversion. After the two reading results of the pixel photodiode PD2 in the first column and the first row are transmitted to the PGA module, the decode module opens the output switches S3 and S4 of the transmission circuit R2_2 and closes the output switches S3 and S4 of the other three transmission circuits, so as to transmit the two-reading results of the pixel photodiode PD2 of the pixel group in the first column and the second row of the pixel array to the PGA module 403 simultaneously through the first and second data buses. By analogy, the data of the pixel photodiodes PD2 of the four pixel groups in the first column are successively transmitted to the PGA module and the pipelined ADC module to be processed and the converted digital data of the pixel photodiode PD2 of the four pixel groups in the first column are finally outputted in sequence.

Similarly, during the time period of T3, the decode module controls the first transmission circuits (R1_1, R2_1, R3_1, R4_1) to transmit the data of the pixel photodiodes PD3 of the pixel groups in the first column; and during the time period of T4, the decode module controls the second transmission circuits (R1_2, R2_2, R3_2, R4_2) to transmit the data of the pixel photodiodes PD4 of the pixel groups in the first column. Finally, during the time period from T1~T4, the data of the pixel groups in the first column is completed outputted. Afterwards, the decode modules controls the row select signal ROW to select the pixel groups in the second column to perform data transmission of the pixel groups in the second column, and so on, until the data of the pixels of the pixel groups in all the column are transmitted.

For each switch control module, the first transmission circuit and the second transmission circuit alternately outputs the data of the pixel photodiodes of the pixel groups in the corresponding row. On the other hand, all the switch control modules share one programmable gain amplifier and one pipelined analog-to-digital converter. Therefore, before the second transmission circuits (or the first transmission circuits) finish the two reading operation, the reading results (the first data and the second data) of the first transmission circuits (or the second transmission circuits) should already be transmitted to the PGA module by which the data is processed and then transmitted to the pipelined ADC module for A/D conversion. That is, the time period for series transmitting the pixel data of the pixel photodiodes PD1 of the pixel groups in the first column begins after the completion of the two-reading operation of these pixel photodiodes PD1 and ends before the completion of the two-reading operation of the pixel photodiodes PD2 of the pixel groups in the first column. Such time period can also be considered as the PGA performing time and the ADC performing time.

In summary, when the image sensor works in the pixel splitting mode, the data of the pixel groups is transmitted column-by-column. While for each column, the data of the pixel photodiodes PD1 of all the pixel groups in the column are transmitted by the first transmission circuits firstly, followed by the data of the pixel photodiodes PD2 of all the pixel groups in the column transmitted by the second transmission circuits, the data of the pixel photodiodes PD3 of all the pixel groups in the column transmitted by the first transmission circuits and the data of the pixel photodiodes PD4 of all the pixel groups in the column transmitted by the second transmission circuits.

Figure 8:
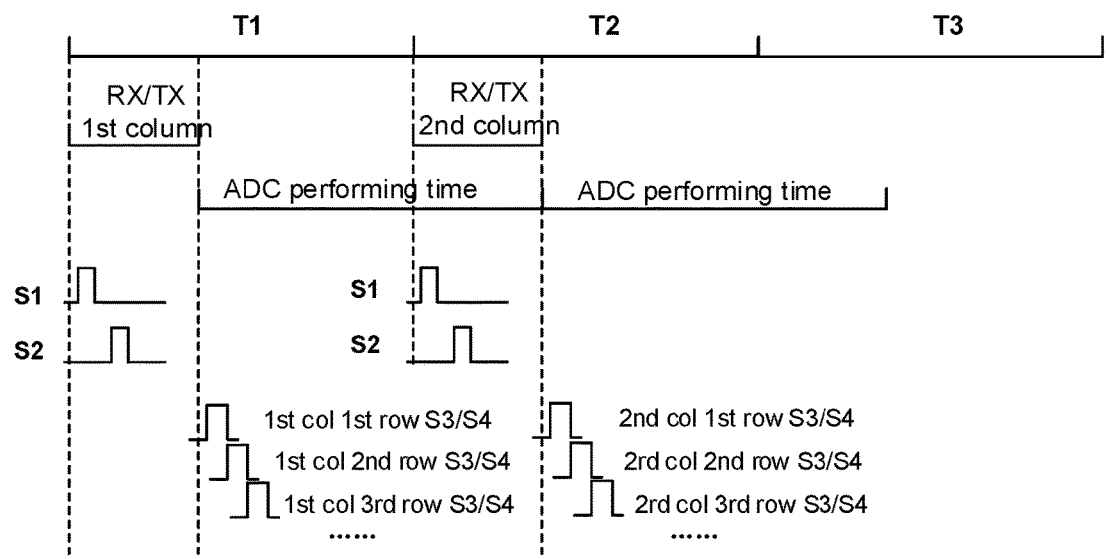
FIG. 8 is a sequence diagram showing the data transmission of the image sensor in the pixel binning mode in an embodiment of the present invention.

FIG. 6 is sequence diagram showing the data transmission of the image sensor in the pixel binning mode (the data of the pixels in the same pixel group are combined to be outputted) in an embodiment of the present invention. In the embodiment, the unit pixel is consisted of four pixels in the same pixel group. The data transmission will be described with reference to FIG. 5b, FIG. 6 and FIG. 8.

The pixel array shown in FIG. 5b comprises 4×4 pixel groups, and each pixel group comprises four pixels, each pixel has a pixel photodiode (PD1/PD2/PD3/PD4). Four switch control modules (R1, R2, R3, R4) are provided corresponding to the number of the rows of the pixel array and each switch control module comprises two transmission circuits (such as R1_1 and R1_2). When the exposure of the image sensor is completed, the unit pixel data are transmitted column-by-column from the first column of the pixel array until all the unit pixel data are transmitted completely. In the pixel binning mode, the four pixel photodiodes PD1, PD2, PD3 and PD4 are combined to form a single unit photodiode PD0, and thus one pixel group forms a unit pixel. FIG. 6 is a sequence diagram illustrating the data transmission of the pixel groups in two columns during the time periods from T1 to T2 when the image sensor works in the pixel binning mode.

During the time period of T1, the first transmission circuits (R1_1, R2_1, R3_1, R4_1) transmit the data of the unit pixel photodiodes PD0 (the combined data of the pixel photodiodes PD1, PD2, PD3, PD4) in the first column while the second transmission circuits are turned off. To be specific, firstly, the decode module sets the select signal ROW to high potential to turn on the row select transistor 202 and select the four pixel groups in the first column of the pixel array, and sets the RX signals of the transistors 203 in the reading circuits of the four pixel groups in the first column to high potential, thus the corresponding transistors 203 are turned on, and each floating diffusion node P is coupled to the supply voltage Vdd to empty and rest the charges at the floating diffusion node P. At this time, the voltage at the floating diffusion node is approximately equal to Vdd, such as 3.3V. The output voltage of the reading circuit equals to the supply voltage subtracting the gate-to-source voltage of the source follower transistor and the drain-to-source voltage of the row select transistor, which is referred as the first data. The decode module opens the four read switches 41 of the four first transmission circuits (R1_1, R2_1, R3_1, R4_1) to perform the first reading of the first data transmitted by the reading circuits and meanwhile keeps the output switches S3, S4 and the read switches S2 off so as to store the four first reading results into the capacitances C1 of the four first transmission circuits respectively. Then the decode module turns off the four read switches S1. After that, the decode module sets the RX signals to low potential so as to close the rest transistors 203 and sets the gate signals TX1, TX2, TX3 and TX4 to high potential to open the transfer transistors 201~204 connected to the pixel photodiodes PD1~PD4. Thus, the charges generated from the pixel photodiodes PD1~PD4 are transmitted to the floating diffusion node P, and the output voltage of each reading circuit is the voltage at the floating diffusion node P subtracting the gate-to-source voltage of the source follower transistor and the drain-to-source voltage of the row select transistor, which is referred as the second data. The decode module opens the four read switches S2 of the four first transmission circuits to perform a second reading of the second data while keeps the output switches S3, S4 and the read switches S2 of the first transmission circuits closed so as to store the four second reading results into the four capacitances C2 of the first transmission circuits respectively. Then, the decode module sets the gate signal TX1~TX4 to low potential. Accordingly, each first transmission circuit (R1_1/R2_1/R3_1/R4_1) stores the first data in the capacitance C1 after the first reading and stores the second data in the capacitance C2 after the second reading, each first and second data represents the data of the unit pixel photodiode PD0.

Furthermore, the decode module controls the four first transmission circuits to transmit the unit pixel data successively. To be specific, the decode module firstly opens the output switches S3 and S4 of the first transmission circuit R1_1 simultaneously while keeps the output switches S3, S4 of the other first transmission circuits R2_1, R3_1, R4_1 closed. Therefore the two-reading results of the data of the unit pixel photodiode PD0 (four combined pixel data) of the pixel group in the first row and the first column are transmitted to the PGA module 403 through the first data bus and the second data bus simultaneously. The PGA module 403 subtracts the two-reading results to obtain the difference of the supply voltage Vdd and the voltage of the unit pixel photodiode PD0, amplifiers the difference and outputs to the pipelined ADC module 404 for A/D conversion. After the two-reading results are completely transmitted to the PGA module by the first transmission circuit R1_1, the decode module opens the output switches S3 and S4 of the first transmission circuit R2_1 while keeps the output switches S3, S4 of the other first transmission circuits closed, thus the two-reading results of the unit pixel photodiode PD0 of the pixel group in the first column and the second row of the pixel array are simultaneously transmitted to the PGA module through the first data bus and the second data bus to be processed and outputted to the pipelined ADC module. By analogy, the data of the unit pixel photodiodes PD0 of the four pixel groups in the first column are successively transmitted to the pipelined ADC and the converted digital data are outputted in sequence.

Next, during the time period of T2, the decode module controls the four second transmission circuits (R1_2, R2_2, R3_2, R4_2) to output the data of the unit pixel photodiodes PD0 of the four pixel groups in the second column while keeps the first transmission circuits closed.

To be specific, firstly, the decode module sets the select signal ROW to high potential to turn on the row select transistors 202 to select the four pixel groups in the second column of the pixel array, and sets the RX signals of the transistors 203 in the reading circuits of the four pixel groups in the second column to high potential. The output voltage of each reading circuit equals to the supply voltage at the floating diffusion node P subtracting the gate-to-source voltage of the source follower transistor and the drain-to-source voltage of the row select transistor, which is referred as the first data. The decode module opens the four read switches S1 of the four first transmission circuits (R1_1, R2_1, R3_1, R4_1) to perform the first reading of the first data transmitted by the reading circuits and meanwhile keeps the output switches S3, S4 and the read switches S2 of the four second transmission circuits off so as to store the four first reading results into the capacitances C1 of the four second transmission circuits respectively. Then the decode module turns off the four read switches S1. After that, the decode module sets the RX signals to low potential so as to close the rest transistors 203 and sets the gate signals TX1, TX2, TX3 and TX4 to high potential to open the transfer transistors 201~204 connected to the pixel photodiodes PD1~PD4. Thus, the charges generated from the pixel photodiodes PD1~PD4 are transmitted to the floating diffusion node P, and the output voltage of each reading circuit equals to the voltage at the floating diffusion node P subtracting the gate-to-source voltage of the source follower transistor and the drain-to-source voltage of the row select transistor, which is referred as the second data. The decode module opens the four read switches S2 of the four first transmission circuits to perform a second reading of the second data while keeps the output switches S3, S4 and the read switches of the second transmission circuits closed so as to store the four second reading results into the four capacitances C2 of the second transmission circuits respectively. Then, the decode module sets the gate signal TX1~TX4 to low potential.

Furthermore, the decode module controls the four second transmission circuits to transmit the unit pixel data successively. To be specific, the decode module firstly opens the output switches S3 and S4 of the second transmission circuit R1_2 simultaneously while keeps the output switches of the other second transmission circuits R2_2, R3_2, R4_2 closed. Therefore the two-reading results of the data of the unit pixel photodiode PD0 (four combined pixel data) of the pixel group in the first row and the second column are transmitted to the PGA module 403 through the first data bus and the second data bus simultaneously. The PGA module 403 subtracts the two-reading results and amplifiers the subtraction result and outputs to the pipelined ADC module 404 for A/D conversion. After the two-reading results are completely transmitted to the programmable gain amplifier by the second transmission circuit R1_1, the decode module opens the output switches S3 and S4 of the second transmission circuit R2_2 while keeps the output switches of the other second transmission circuits closed, thus the two-reading results of the unit pixel photodiode PD0 of the pixel group in the second column and the second row of the pixel array are transmitted to the PGA module through the first data bus and the second data bus to be processed and outputted to the pipelined ADC module. By analogy, the data of the unit pixel photodiodes PD0 of the four pixel groups in the second column are successively transmitted to the pipelined ADC module and the converted digital data are outputted in sequence. After the unit pixel data of the pixel groups in the second column are outputted, the decode module controls the row select signal ROW to select the pixel groups in the third column and controls the first transmission circuits to transmit the data of the unit pixel photodiodes PD0 of the pixel groups in the third column, and so on, until all the unit pixel data of the pixel array are outputted.

It is concluded that for each switch control module, the first transmission circuit and the second transmission circuit alternately outputs the data of the unit pixel photodiodes PD0 of the pixel groups in the different columns. Since all the switch control modules share one PGA module and one pipelined ADC module, before the second transmission circuits (or the first transmission circuits) finish the two reading operation, the reading results of the first transmission circuits (or the second transmission circuits) should already be transmitted to the PGA module by which the data is processed and then transmitted to the ADC module for A/D conversion. That is, the time period for series transmitting the data of the unit pixel photodiodes PD0 of the pixel groups in one column begins after the completion of the two reading operation of these unit pixel photodiodes PD0 and ends before the completion of the two reading operation of the unit pixel photodiodes PD0 of the pixel groups in the next column. Such time period can also be considered as the operation time of the PGA performing time and the ADC performing time.

In summary, the image sensor of the present invention has the following advantages:

Firstly, by setting the unit pixel, the image sensor can be switched between the pixel splitting mode and the pixel binning mode so as to adjust the resolution of the image sensor to satisfy the requirements of the image quality under different conditions, which extends the applications of the image sensor.

Secondly, by utilizing two transmission circuits alternately transmitting the unit pixel data, the requirements for the sampling rate of the pipelined ADC can be greatly reduced. Specifically, if only one transmission circuit is utilized, after the two reading operation are completed during the time period T1 and before the first reading operation starts in the time period T2, all the data stored in the capacitances have to be transmitted to the PGA module and the pipelined ADC module to be processed in time, as all the data stored in the capacitances will be refreshed when the first reading operation is performed as the time period T2 begins. For example, it is assumed that T1=T2=15 µs, the time needed for the first and second reading operations is totally 10 µs, then the PGA and ADC performing time is only 5 µs. For a 1920*1080 image sensor (1080p full HD image sensor), the pixel number needs to be transmitted within 5 µs is 1920/2=960, thus the sample frequency of the pipelined ADC module is at least ⅕ us*960=192 MHz. If the ADC is a 12-bit ADC, a 192 MHz 12-bit ADC will be area and power consuming. By contrast, the present invention utilizes two transmission circuits, the time period between the completion of the two reading operation of the unit pixel data (such as the data of the pixel photodiode PD1) of the pixel groups in the first column and the completion of the two reading operation of another unit pixel data (such as the data of the pixel photodiode PD2) of the pixel groups in the first column can be used for serial data transmission of the data of the pixel photodiodes PD1, that is the PGA and ADC performing time. Therefore, the ADC performing time is approximately 15 µs as the PGA performing time is very short. For a 1920*1080 image sensor, the pixel number needed to be transmitted within 15 µs is 1920/2=960, thus the sampling frequency of the pipelined ADC is 1/15 µs*960=64 MHz, compared with a 192 MHz 12-bit pipelined ADC, the 64 MHz 12-bit pipelined ADC has the advantages of lower design difficulty and reduced power and area consumption.

Furthermore, the image sensor based on the pipelined ADC can solve the difficulties brought by the layout height restriction of the column ADC. The design of the capacitance C1, C2 and the switches S1, S2, S3, S4 in the transmission circuits also effectively reduce the layout of the image sensor. Therefore, the pixel size of the image sensor of the present invention can be reduced, even to below 2.5 µm. Moreover, by utilizing only one pipelined ADC module to perform the A/D conversion for all the unit pixel data, the structure of the image sensor is much more simplified.

In addition, the PGA module performs subtraction to the received two-path data and gain amplification to the subtraction results as controlled, which can be applied to obtain various gain amplification according to the different colors required by the R/G/B unit pixels.

Although the present invention has been disclosed as above with respect to the preferred embodiment, they should not be construed as limitations to the present invention. Various modifications and variations can be made by the ordinary skilled in the art without departing the spirit and scope of the present invention. Therefore, the protection scope of the present invention should be defined by the appended claims.

The invention claimed is:

1. An image sensor, comprising:
a pixel array module including a plurality of pixel groups arranged in P rows and Q columns, each of the pixel groups comprises multiple pixels, the multiple pixels form at least one unit pixel, wherein P, Q are positive integers;
multiple switch control modules each corresponds to one row of the pixel array module to read out the data of the unit pixels, each switch control module comprises a first transmission circuit and a second transmission circuit;
a programmable gain amplifier connected to the first transmission circuits and the second transmission circuits of all the rows of the pixel array module configured to process the data read out from the first transmission circuits and the second transmission circuits;
a pipelined analog-to-digital converter connected to the programmable gain amplifier configured to convert the data outputted by the programmable gain amplifier into digital data;
a decode module configured to control the first transmission circuit and the second transmission circuit corresponding to each row to alternately read and transmit the data of the unit pixels of the row, and control all the first transmission circuits and the second transmission circuits to successively output the data read out thereby to the programmable gain amplifier.

2. The image sensor according to claim 1, wherein each pixel group comprises a reading circuit, the first transmission circuit and the second transmission circuit corresponding to each row are connected to the output terminals of the reading circuits of the row; the decode module controls the reading circuits corresponding to the same row to successively output the data of the unit pixels in the row, and controls the first transmission circuit and the second transmission circuit to alternately read and transmit the data read out by the reading circuits of the corresponding row to the programmable gain amplifier.

3. The image sensor according to claim 2, wherein each of the reading circuits comprises multiple transfer transistors, a floating diffusion node, a reset transistor, a source follower transistor and a row select transistor, wherein the multiple transfer transistors are respectively connected to the pixel photodiodes of the pixel group; the drain electrodes of the multiple transfer transistors, the gate electrode of the source follower and the source electrode of the reset transistor are connected at the floating diffusion node; the drain electrode of the row select transistor is connected to the source electrode of the source follower, the source electrode of the row select transistor is connected to the input terminals of the first transmission circuit and the second transmission circuit.

4. The image sensor according to claim 3, wherein the decode module controls each of the reading circuits to read out a first data when the reset transistor thereof empties and resets the charges accumulated at the floating diffusion node and thereafter read out a second data when the transfer transistors corresponding to one of the unit pixels are turned on, wherein the first data and the second data represent the data of the unit pixel.

5. The image sensor according to claim 4, wherein each of the transmission circuits comprises a first capacitance configured to read the first data and a second capacitance configured to read the second data; the output terminals of the first capacitances are connected to the programmable gain amplifier module through a first data bus, the output terminals of the second capacitances are connected to the programmable gain amplifier module through a second data bus; for any of the transmission circuits, the decode module controls the first capacitance and the second capacitance to successively read the first data and the second data and simultaneously transmit the two reading results to the programmable gain amplifier module through the first data bus and the second data bus.

6. The image sensor according to claim 5, wherein the programmable gain amplifier module subtracts the two reading results to obtain the data of the unit pixel and then amplifies and outputs to the analog-to-digital converter module.

7. The image sensor according to claim 6, wherein each of the first capacitances or the second capacitance is configured to have one end connected to the ground and the other end connected to a read switch and an output switch in series with the read switch, the read switch is connected to the input terminal of the first transmission circuit or the second transmission circuit and the output terminal is connected to the first data bus or the second data bus.

8. The image sensor according to claim 7, wherein the decode module controls all the first/second transmission circuits to read a group of the unit pixel data outputted by the reading circuits of the pixel groups in one column simultaneously and then serially transmit the read data of the unit pixels to the programmable gain amplifier module; when the data of the unit pixels read by the first/second transmission circuits is transmitted completely, the decode module controls all the second/first transmission circuits to read a next group of the unit pixel data outputted by the same reading circuits or the reading circuits of the pixel groups in the next column.

9. The image sensor according to claim 7, wherein the decode module controls the first capacitances of the P first/second transmission circuits to read the first data outputted by the reading circuits of the pixel groups in one column simultaneously and then controls the second capacitances of the P first/second transmission circuits to read the second data outputted by the same reading circuits simultaneously after the reading of the first data is completed so as to obtain P two-reading results; the decode module controls the P two-reading results to be successively transmitted to the programmable gain amplifier module.

10. The image sensor according to claim 6, wherein the decode module controls all the first/second transmission circuits to read a group of the unit pixel data outputted by the reading circuits of the pixel groups in one column simultaneously and then serially transmit the read data of the unit pixels to the programmable gain amplifier module; when the data of the unit pixels read by the first/second transmission circuits is transmitted completely, the decode module controls all the second/first transmission circuits to read a next group of the unit pixel data outputted by the same reading circuits or the reading circuits of the pixel groups in the next column.

11. The image sensor according to claim 6, wherein the decode module controls the first capacitances of the P first/second transmission circuits to read the first data outputted by the reading circuits of the pixel groups in one column simultaneously and then controls the second capacitances of the P first/second transmission circuits to read the second data outputted by the same reading circuits simultaneously after the reading of the first data is completed so as to obtain P two-reading results; the decode module controls the P two-reading results to be successively transmitted to the programmable gain amplifier module.

12. The image sensor according to claim 5, wherein the decode module controls the first capacitances of the P first/second transmission circuits to read the first data outputted by the reading circuits of the pixel groups in one column simultaneously and then controls the second capacitances of the P first/second transmission circuits to read the second data outputted by the same reading circuits simultaneously after the reading of the first data is completed so as to obtain P two-reading results; the decode module controls the P two-reading results to be successively transmitted to the programmable gain amplifier module.

13. The image sensor according to claim 5, wherein the decode module controls all the first/second transmission circuits to read a group of the unit pixel data outputted by the reading circuits of the pixel groups in one column simultaneously and then serially transmit the read data of the unit pixels to the programmable gain amplifier module; when the data of the unit pixels read by the first/second transmission circuits is transmitted completely, the decode module controls all the second/first transmission circuits to read a next group of the unit pixel data outputted by the same reading circuits or the reading circuits of the pixel groups in the next column.

14. The image sensor according to claim 4, wherein the decode module controls all the first/second transmission circuits to read a group of the unit pixel data outputted by the reading circuits of the pixel groups in one column simultaneously and then serially transmit the read data of the unit pixels to the programmable gain amplifier module; when the data of the unit pixels read by the first/second transmission circuits is transmitted completely, the decode module controls all the second/first transmission circuits to read a next group of the unit pixel data outputted by the same reading circuits or the reading circuits of the pixel groups in the next column.

15. The image sensor according to claim 3, wherein the decode module controls all the first/second transmission circuits to read a group of the unit pixel data outputted by the reading circuits of the pixel groups in one column simultaneously and then serially transmit the read data of the unit pixels to the programmable gain amplifier module; when the data of the unit pixels read by the first/second transmission circuits is transmitted completely, the decode module controls all the second/first transmission circuits to read a next group of the unit pixel data outputted by the same reading circuits or the reading circuits of the pixel groups in the next column.

16. The image sensor according to claim 2, wherein the decode module controls all the first/second transmission circuits to read a group of the unit pixel data outputted by the reading circuits of the pixel groups in one column simultaneously and then serially transmit the read data of the unit pixels to the programmable gain amplifier module; when the data of the unit pixels read by the first/second transmission circuits is transmitted completely, the decode module controls all the second/first transmission circuits to read a next group of the unit pixel data outputted by the same reading circuits or the reading circuits of the pixel groups in the next column.

17. A data transmission method of the image sensor according to claim 1 comprising:
  Step S1, setting the unit pixel;
  Step S2, performing pixel data reading out, processing and analog-to-digital conversion to the unit pixels of the pixel array module;
  wherein for each row of the pixel array module, the data of the unit pixels in the row is read and outputted alternately and successively by the corresponding first transmission circuit and second transmission circuit; wherein for the pixel array module, the data of the unit pixels readout by the first transmission circuits and the second transmission circuits is successively outputted to the programmable gain amplifier module.

18. The signal transmission method according to claim 17, wherein for all the rows of the pixel array module, the data of the P unit pixels readout by the first/second transmission circuits each time is successively and serially transmitted to the programmable gain amplifier module to be processed and outputted to the pipelined analog-to-digital converter module, and when the data of the P unit pixels previously read by the first/second transmission circuits is transmitted completely, the second/first transmission circuits start a next reading of the data of the P unit pixel.

19. The signal transmission method according to claim 18, wherein each of the pixel groups comprises a reading circuit, the first transmission circuit and the second transmission circuit are connected to the output terminals of the reading circuits of the pixel groups in the corresponding row; each of the reading circuits comprises multiple transfer transistors respectively connected to the pixel photodiodes of the pixel group, a floating diffusion node, a reset transistor, a source follower transistor and a row select transistor, wherein the Step S2 further comprises:
  S20: turning on one transmission circuit while turning off the other transmission circuit of each switch control module;
  S21: performing charge empty and reset to the floating diffusion node of the reading circuit of the $i^{th}$ pixel group in each row of the pixel array module, and reading out a first data by the reading circuit;
  S22: reading the P first data through all the turned on transmission circuits;
  S23: turning on the transfer transistors corresponding to the $j^{th}$ unit pixel of the $i^{th}$ pixel group in each row of the pixel array module and reading out a second data by the reading circuit, wherein i, j are both positive integers, i is less than or equal to Q, j is less than or equal to the quantity of the unit pixels;
  S24: reading the P second data through all the turned on transmission circuits, wherein each of the first data and the second data form a two-path data;
  S25: transmitting the P two-path data to the programmable gain amplifier module successively and processing the received P two-path data by the programmable gain amplifier module; wherein each two-path data is transmitted to the programmable gain amplifier module simultaneously through the first bus and the second bus;
  S26: performing analog-to-digital conversion to the processed data outputted by the programmable gain amplifier module and outputting the corresponding digital data successively;

S27: turning off the turned on transmission circuit and turning on the turned off transmission circuit;

S28: repeating the steps S21 to S27 until the digital data of all the unit pixel in the pixel array module is serially outputted.

20. The signal transmission method according to claim 18, each of the transmission circuits comprises a first capacitance and a second capacitance, each of the first capacitances or the second capacitances is configured to have one end connected to the ground and the other end connected to a read switch and an output switch in series, the read switch is connected to the input terminal of the first transmission circuit or the second transmission circuit and the output switch is connected to the first data bus or the second data bus, wherein the first data bus and the second data bus are both connected to the programmable gain amplifier module;

wherein the Step S22 comprises:

turning on the read switches connected to the first capacitances, turning off the output switches connected to the first capacitances and turning off the read switches and the output switches connected to the second capacitances to store the first data into the first capacitances;

wherein the Step S24 comprises:

turning on the read switches connected to the second capacitances, turning off the output switches connected to the second capacitances and turning off the read switches and the output switches connected to the first capacitances to store the second data into the second capacitances;

wherein in the Step 25, for each transmission circuit, the output switches respectively connected to the first capacitance and the second capacitance are turned on simultaneously and the read switches respectively connected to the first capacitance and the second capacitance are turned off simultaneously so as to output each of the two-path data at a same time through the first data bus and the second data bus.

* * * * *